US012060999B2

(12) United States Patent
Lee et al.

(10) Patent No.: US 12,060,999 B2
(45) Date of Patent: Aug. 13, 2024

(54) OVEN RANGE

(71) Applicant: LG ELECTRONICS INC., Seoul (KR)

(72) Inventors: Sangcheol Lee, Seoul (KR); Kyoungjoon Park, Seoul (KR); Yonghyun Lee, Seoul (KR); Jaekyung Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 455 days.

(21) Appl. No.: 17/152,000

(22) Filed: Jan. 19, 2021

(65) Prior Publication Data
US 2021/0325048 A1    Oct. 21, 2021

(30) Foreign Application Priority Data

Apr. 21, 2020    (KR) ........................ 10-2020-0048033

(51) Int. Cl.
*F24C 15/00*    (2006.01)
*H05K 7/20*    (2006.01)

(52) U.S. Cl.
CPC ....... *F24C 15/006* (2013.01); *H05K 7/20145* (2013.01)

(58) Field of Classification Search
CPC ...... F24C 15/006; F24C 15/32; F24C 15/322; F24C 15/101; F24C 15/28; F24C 15/12; F24C 7/082; H05K 7/20145; H05K 7/20136; F23M 5/08; F23M 5/085; F23M 9/006; F23M 9/02; F23M 9/04; F23M 2900/05005
USPC ......... 126/15 R, 15 A, 21 R, 21 A, 193, 195
See application file for complete search history.

(56) References Cited

U.S. PATENT DOCUMENTS

| | | | | |
|---|---|---|---|---|
| 5,430,273 | A * | 7/1995 | Bogdanski | H05B 6/062 336/222 |
| 8,101,891 | B2 * | 1/2012 | Lee | F24C 15/02 219/400 |
| 2005/0133019 | A1 * | 6/2005 | Kim | F24C 15/006 126/198 |
| 2012/0152933 | A1 * | 6/2012 | Matsui | H05B 6/1263 219/623 |
| 2017/0350603 | A1 * | 12/2017 | Je | F24C 15/04 |
| 2019/0101293 | A1 * | 4/2019 | Kim | F24C 15/08 |

FOREIGN PATENT DOCUMENTS

KR    10-0698204    3/2007

* cited by examiner

*Primary Examiner* — Alfred Basichas
(74) *Attorney, Agent, or Firm* — KED & ASSOCIATES

(57) ABSTRACT

An oven range is provided that may include a main body that forms an exterior of the oven range; a cavity that forms a space for cooking an item within the main body; a door coupled to the main body to selectively open and close the cavity; a cooktop provided over the main body; and a controller located over the door and at a front end of the cooktop and having an electronic component installed therein, a cooling flow path being formed in the controller to cool the electronic component.

14 Claims, 14 Drawing Sheets

OVEN RANGE

CROSS-REFERENCE TO RELATED APPLICATION(S)

This application claims priority under 35 U.S.C. § 119 to Korean Application No. 10-2020-0048033, filed in Korea on Apr. 21, 2020, which is hereby incorporated in its entirety by reference as if fully set forth herein.

BACKGROUND

1. Field

An oven range is disclosed herein.

2. Background

Generally, cooking devices are devices that heat and cook items, such as food (hereinafter, collectively "food"), for example, microwave ranges, gas ranges, electric ovens, gas ovens, and oven ranges. Among them, the oven range refers to a device that combines an oven that heats items to be cooked with dry heat after sealing the items in a cavity and a range formed mainly on a top of the oven to cook items to be cooked placed on top of the range by directly heating the items.

The oven range may be classified into a gas oven range or an electric oven range depending on a type of a heat source. In addition, according to an installation method, the oven range is classified into a built-in type that is installed with other kitchen appliances or walling or a freestanding type installed independently in a user-desired location.

An oven range may include a cooktop for cooking an item to be cooked in a manner in which a container having the item to be cooked contained therein is placed on the cooktop and a back guard that discharges smoke and gas generated from the oven externally. The cooktop is configured to perform cooking in the manner in which the container in which the item to be cooked is contained is placed on the cooktop and heated. The cooktop includes a top side exposed at a top portion of the oven range. Generally, a multitude of burners are installed in the cooktop. The burners may include a general open burner installed to be exposed at a top side of the cooktop and a closed burner closed or covered by an insulation means, such as ceramic glass.

The oven is formed under the cooktop to accommodate and cook an item to be cooked. A cavity configuring a cooking room is formed inside of the oven.

At least one heater is installed in the cooking room or cavity. The heater is provided at a location for heating food or other items located in the cooking room or the cavity.

The cooktop and oven may cook food in various ways by receiving an input of a cooking method from a user. An electronic component unit that controls the cooktop and the oven is provided an the oven range.

When the cooktop and the oven are operating, as relatively high temperature is attained, a means for cooling the electronic component unit is necessary. In this regard, Korean Patent Registration Notice No. 10-0698204 (hereinafter, referred to as "related art document"), which is hereby incorporated by reference, discloses an oven range that raises cooling efficiency and minimizes heat loss by improving a structure of an air blowing fan, an intake duct, and an exhaust duct to cool an electronic component unit. More particularly, the related art document discloses an oven range including an electronic component room having electronic components installed therein to drive the oven range and an air blowing fan provided within the electronic component room to form an air current.

However, according to the related art document, the air blowing fan forms a cooling flow path in the electronic component room in a frontward-rearward direction. That is, the related art document discloses the oven range further including an intake duct that guides air, which is located outside of the oven range, to the electronic component room, and a discharge duct that discharges the air located in the electronic component room from the oven range, to form a flow path for cooling the electronic component room. In this case, the intake duct and the discharge duct for that forms the flow path in the frontward-rearward direction of the oven range may require a higher unit cost.

In addition, there is a problem that an electronic component unit, for example, a printed circuit board (PCB) that controls an oven and cooktop by receiving a cooking method from a user, may not be cooled efficiently. Thus, demand for lowering the unit cost and efficiently cooling the electronic component unit is rising.

BRIEF DESCRIPTION OF THE DRAWINGS

Embodiments will be described in detail with reference to the following drawings in which like reference numerals refer to like elements, and wherein.

DETAILED DESCRIPTION

Reference will now be made to embodiments with reference to the accompanying drawings. The following detailed descriptions are provided to assist in a comprehensive understanding of the methods, devices and/or systems described in the present specification. However, this is only an example and non-limiting.

In describing embodiments, if it is deemed that a specific description of the known technology associated with the embodiments may unnecessarily obscure the gist, the detailed description shall be omitted. In addition, the terms described in the following are defined in consideration of functions, which may vary depending on user's intention, operator's intention, practices, etc. Therefore, the definition should be based on the full text of the present specification. The terms used in the description are merely to describe the embodiments, and should never be restrictive. Unless clearly used otherwise, the singular form of expression includes multiple forms of meaning. In the present description, such a terminology as 'include', 'have' and the like intends to designate that features, numbers, steps, operations, components, and a part or combination thereof disclosed in the specification and should be understood as not excluding possibility of existence or addition of at least one or more features, numbers, steps, operations, components, and parts or combinations thereof.

Hereinafter, oven range 10 is described with reference to FIG. 1 and FIG. 2.

Figure 1:
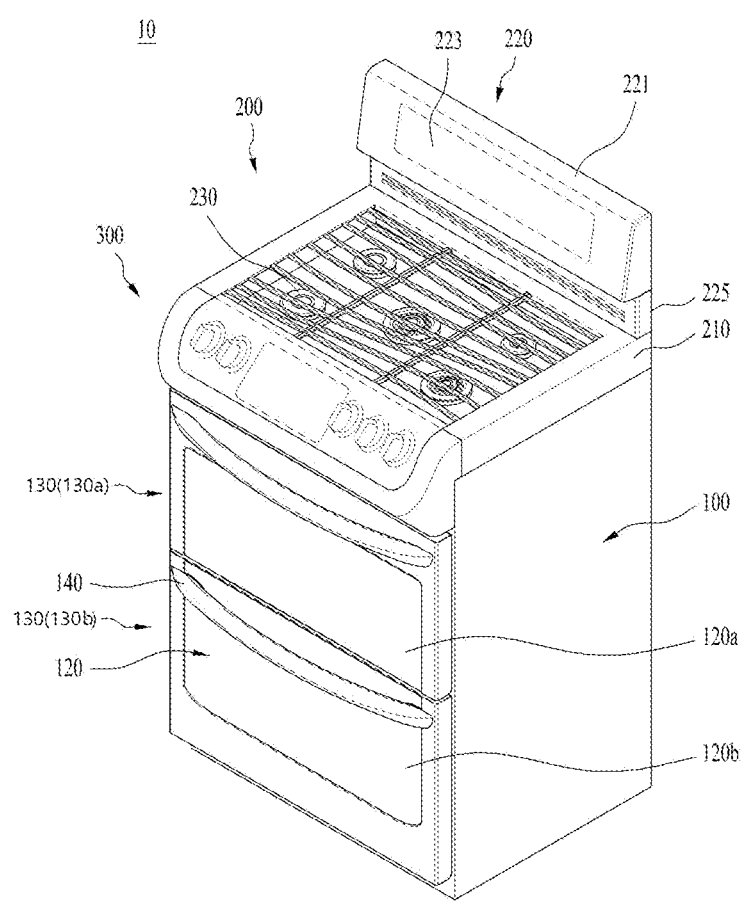
FIG. 1 is a perspective view of an oven range according to an embodiment.
Figure 2:
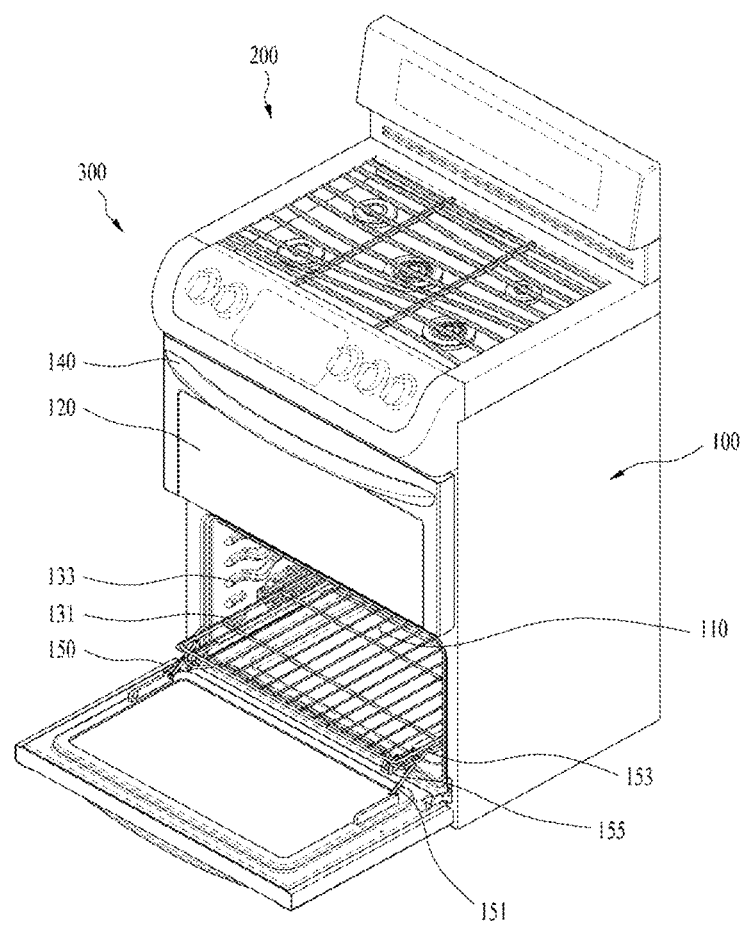
FIG. 2 is a perspective view of the oven range of FIG. 1 showing a door open.

FIG. 1 is a perspective view of an oven range according to an embodiment. FIG. 2 is a perspective view of the oven range, showing a door of the oven range open.

Referring to FIG. 1, the oven range 10 may include a main body 100 forming an exterior and a cooktop unit 200 provided on the main body 100. The main body 100 may be configured in an approximately rectangular parallelepiped shape, and a cavity 110 for cooking food or other items (hereinafter, collectively "food") may be formed inside of the main body 100. Hence, the cavity 110 forms a cooking room for cooking food.

A door 120 may be coupled to the main body 100 to selectively open and close the cavity 110. The door 120 may form a front side of the main body 100.

The door 120 may selectively open and close the cavity 110 in a manner of being moved back and forth by being coupled to the main body 100. In this case, the door 120 may be coupled in a manner of being rotatably coupled to the main body 100. That is, the door 120 may be rotated in a manner that a position is changeable upward and downward with respect to an axis that extends in a widthwise direction of the main body 100. Alternatively, the door 120 may selectively open and close the cavity in a manner of being slidable into the main body.

A handle 140 may be provided to or on the door 120 so that a user may smoothly and selectively open and close the cavity 110.

When the door 120 is slidably coupled to the main body 100, the handle 140 may be configured in a manner of being recessed toward the cavity 110 from an outer surface of the door 120. When the door 120 is rotatably coupled to the main body 100, the handle 140 may form a grip that protrudes from the outer surface of the door 120 in a direction away from the cavity 110 so as to be gripped by a user. Thus, the main body 100 and the door 120 may be coupled together, thereby configuring an oven 130 that cooks food.

The cavity 110 may form a space to cook food in the oven 130. A heater (not shown) that heats food may be provided in the oven 130. The heater 160 may be located on one inner surface of the main body 100 and provide heat to cook the food. For example, the heater may be located between the main body 100 and the cooktop 200 or on a backside of the main body 100.

The heater may be provided in various ways as a means to provide heat. The heater may include a heater element (not shown) that generates heat and a heater fan 163 that transfers the heat generated from the heater to the cavity 110. The heater element may include one or more of a sheath heater, a charcoal heater, a halogen heater, a broil heater, or a bake heater.

The heater may further include the heater fan 163 that transfers the heat generated from the heater to the cavity 110 or an inside of the oven 130, whereby food may be cooked. The heater fan 163 may be located on one side of the cavity 110 or within the main body 100, thereby forcing a flow of air. For example, the heater fan 163 may be located on or at a backside of the cavity 110 or a backside of the main body 100, thereby forcing a flow of air to cook food.

A plurality of the ovens 130 may be provided. That is, the oven 130 may include a first oven 130a (with door 120a) and a second oven 130b (with door 120b), which may be vertically disposed, respectively. A partition wall may be situated between the first oven 130a and the second oven 130b, thereby forming independent cooking spaces, respectively. Description of the first and second ovens 130a and 130b redundant with the aforementioned oven 130 has been omitted, except for noting that a plurality of the ovens may be provided.

The cooktop 200 may be located on the main body 100 so as to be exposed externally. The cooktop unit 200 may include a cooktop frame 210 coupled to the main body 100 to form an exterior and a cooktop heater 230 located on a top side of the cooktop frame 210 to form a space to cook food. An insulation means that insulates the cooktop 200 from the oven 130 may be provided within the cooktop frame 210.

The cooktop heater 230 may include at least one of various heaters, such as a gas burner, a radiant burner, and an Induction Heater (IH), for example. Therefore, a user may cook food in a manner of putting food in a container and placing the container on the cooktop heater 230.

In order to cook food placed on the cooktop 200 or in the oven 130, a user may input various instructions. In addition, a means for a user to apply an input for operating the oven range 100, for example, a self-clean mode, as well as a food cooking method may be provided.

Therefore, the oven range 10 may include a controller 300 located at a top portion or top of the main body 100 and a front end portion or end of the cooktop 200 to control the oven range 10 by receiving an input of information on cooking from a user. The controller 300 will be described hereinafter with reference to FIG. 4.

The oven range 10 may include a back guard 220 that discharges smoke or byproducts generated from a process for cooking food in the cavity 110, the oven 130, or the cooktop 200. The back guard 220 may be located at the top portion of the main body 100 and a backside of the cooktop 200 and externally discharge byproducts generated during cooking from the oven range 10.

The back guard 220 may include a back guard body 221 provided at a position spaced apart from the cooktop 200 and an extending portion 225 that connects the back guard body 221 and the cooktop 200 together in a manner that the back guard body 221 is spaced apart from the cooktop 200. One or a first end of the extending portion 225 may be coupled to the cooktop 200 and the other or a second end may be coupled to the back guard body 221.

A back guard display 223 may be formed at the back guard body 221 to display information on a state of the oven range 10. Thus, although the oven range 10 operates and reaches a high temperature, the back guard display 223 is spaced apart from the cooktop 200.

Operation of the door 120 is described hereinafter with reference to FIG. 2. Although the door 120 shown in FIG. 1 and FIG. 2 depicts a case of being rotatably coupled to the main body 100, as described above, the door 120 may be slidably coupled to the main body 100.

A rack 131 that accommodates food therein and a rack support rib 133 having the rack 131 slidably coupled thereto may be provided within the oven 130. The rack 131 may be configured in an approximately rectangular shape, and a plurality of perforated holes may be formed in the rack 131.

Hence, heat transferred in the cavity 110 or inside of the oven 130 may be efficiently transferred to food.

The rack support rib 133 may be configured in a manner of being projected from an inner wall of the oven 130 toward the cavity 110 or inward and extending in a frontward-rearward direction. Thus, a user may put food to be cooked on the rack 131 and place the rack 131 inside of the oven 130 or in the cavity 110.

As the door 120 is opened, the rack 131 may be drawn forward simultaneously. That is, a connector 150 may be coupled to the door 120 and the rack 131.

More particularly, the connector 150 may include a door coupling portion 151 coupled to the door 120, a rack coupling portion 153 coupled to the rack 131, and a linking portion 155 configured to connect the door coupling portion 151 and the rack coupling portion 153 together. The door coupling portion 151 may be fixed to one surface of the door 120 facing the cavity 110.

When the door 120 is opened, the door coupling portion 151 is moved forward. Thus, the linking portion 155 may draw the rack 131 forward in response to movement of the door coupling portion 151. Therefore, a user may open the door 120 and access the rack 131 more smoothly.

An electronic component unit may receive input of cooking information from a user and then control the oven range 10 based on the received information. However, when the oven range 10 is operating, the oven range 10 enters a high temperature state. Thus, it is necessary to cool the electronic component unit.

Figure 3:
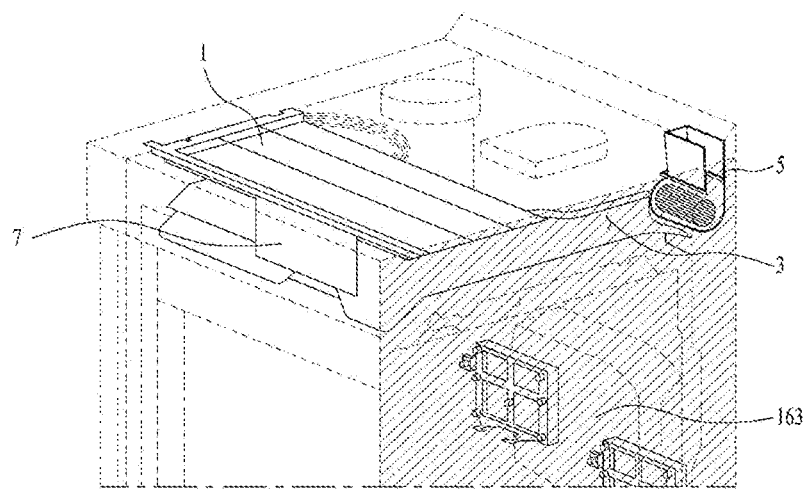
FIG. 3 is a schematic diagram showing a frontward-rearward cooling flow path of a related art oven range.

FIG. 3 is a schematic diagram showing a cooling flow path of a related art oven range to cool an electronic component unit. Referring to FIG. 3, a printed circuit board (PCB) 7 of the related art is installed at a front end portion of a cooktop and a top portion of a main body. To cool the PCB, the oven range of the related art forms a cooling flow path 3 (hereinafter abbreviated as "frontward-rearward cooling flow path") in a frontward-rearward direction.

The frontward-rearward cooling flow path 3 is located on or at a side portion of the cooktop to avoid interference with the cooktop. More particularly, the frontward-rearward cooling flow path 3 is formed between a bottom of the cooktop and a top of the main body and located on the side portion, that is, a left side portion, a right side portion, for example.

A fan 5 is installed to force a flow of air that flows in the frontward-rearward cooling flow path 3. The fan 5 is located at a backside of the cooktop and the top of the main body. Hence, an air current may be formed in frontward-rearward direction by the fan 5.

The air current in the frontward-rearward direction forms an insulation layer between the cooktop and the main body, thereby preventing heat generated from the cooktop from being transferred to the main body and also preventing the heat generated from the main body from being transferred to the cooktop.

However, in the case of the PCB 7 located at the front end portion, it may be difficult to achieve sufficient cooling due to the air current in the frontward-rearward direction. Thus, the related art prevents the heat from being transferred to the PCB by further including an insulation plate 1.

More particularly, the insulation plate 1 is located between the cooktop and the main body in a manner of being inclined toward a front side. Thus, the heat generated from the cooktop or the main body (or the oven) is prevented from being transferred to the PCB.

However, the above-mentioned frontward-rearward cooling flow path of the related art needs more configurations despite cooling the PCB. For example, a flow path should be formed in the frontward-rearward direction and a fan forming an air current should be further installed at the backside of the cooktop. In addition, as it is difficult to achieve sufficient cooling with the frontward-rearward cooling flow path only, the insulation plate 1 should be further included, thereby causing inefficiency from the perspective of manufacturing costs.

Accordingly, one embodiment disclosed herein changes a position of a cooling flow path, thereby enhancing efficiency.

A cooling flow path according to an embodiment is described hereinafter with reference to FIG. 4.

Figure 4:
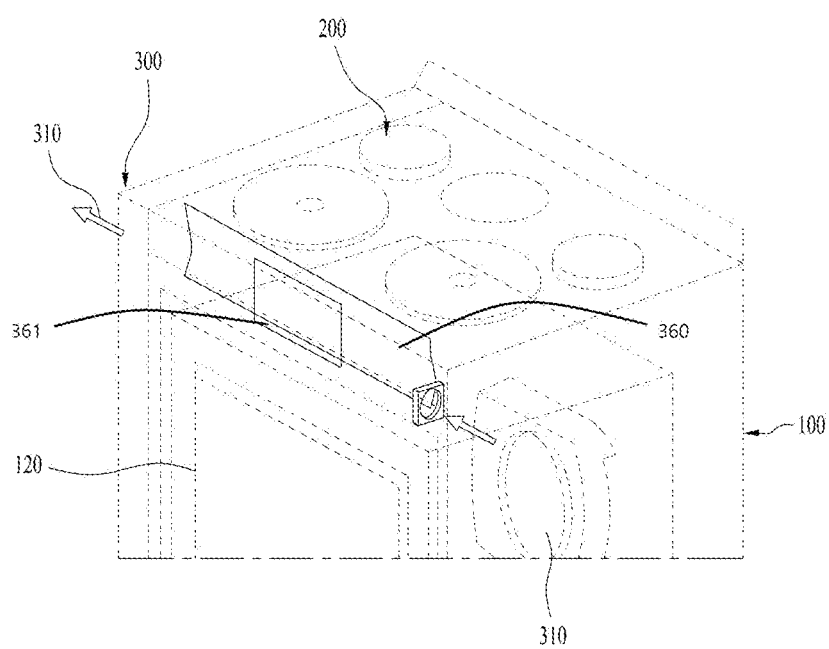
FIG. 4 is a schematic diagram showing a controller according to an embodiment.

FIG. 4 is a schematic diagram showing a controller according to an embodiment. Referring to FIG. 4, controller 300 may be located over the door 120 or at the front end portion of the cooktop 200 and control the oven range 10 by receiving an input of information on cooking or an input of information on an operation of the oven range 10 from a user.

A control printed circuit board (PCB) 361, described hereinafter, may be located at the controller 300, and a cooling flow path 310 that cools the control PCB 361 may be formed in the controller 300. The cooling flow path 310 may extend in a widthwise direction of the controller 300. The term "widthwise direction" of the controller 300 may refer to a lateral direction of the door 120 and a direction from a left side to a right side or a direction from the right side to the left side.

A floor surface on which the oven range 10 is installed is a bottom, and a direction toward the cooktop 200 from the floor surface may refer to an upward or vertical direction. A portion at which the door 120 is located is a front and a position at which the back guard is formed is a rear with reference to the door 120.

As the cooling flow path 310 is formed in the widthwise direction of the door 120 or the widthwise direction of the controller 300, the control PCB 361 may be cooled more efficiently. Considering that the frontward-rearward cooling flow path of the related art intends to reduce heat transferred to the PCB by forming an insulation layer instead of direct cooling by forming a flow of air to the PCB, the cooling flow path 310 according to embodiments is capable of cooling the control PCB 361 directly.

The controller 300 according to an embodiment is described hereinafter with reference to FIG. 5.

Figure 5A:
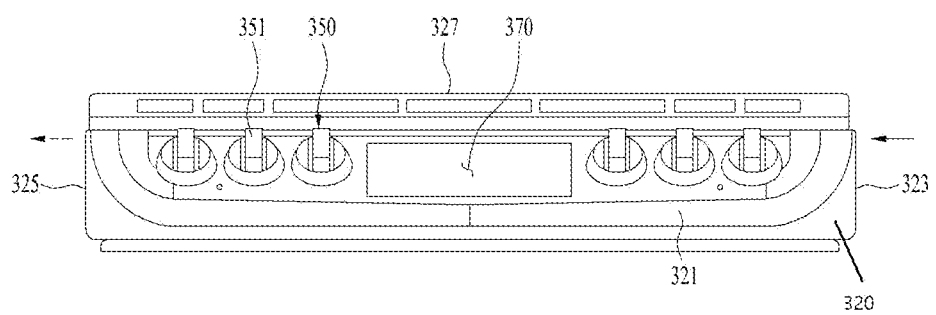
FIGS. 5A-5C are schematic diagrams showing a controller according to an embodiment.
Figure 5B:
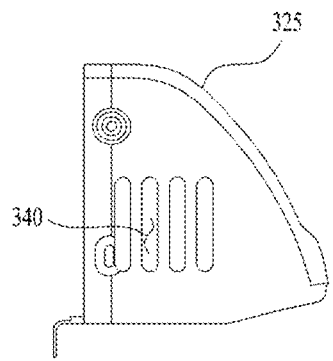
Figure 5C:
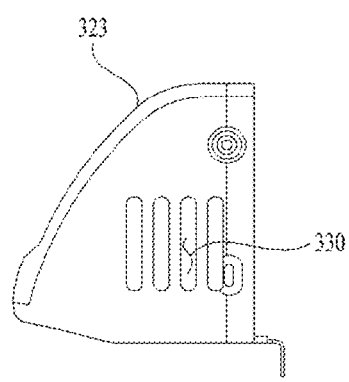

FIG. 5A is a schematic diagram showing a front housing of the controller. FIG. 5B is a schematic diagram showing a first lateral side of the controller. FIG. 5C is a schematic diagram showing a second lateral side of the controller.

Controller 300 may include cooling flow path 310 formed in a widthwise direction of the controller 300 or a widthwise direction of the door 120, and a control housing 320 forming an exterior of the controller 300. The control housing 320 forms an accommodation space S in which an electronic component unit 360 may be located. Hence, the electronic component unit 360 may be located within the control housing 320.

The control housing 320 may include a front housing 321 forming a front side and lateral sides 325 and 323 formed on both ends of the front housing 321. The front housing 321 may form a body that connects the lateral sides 323 and 325 together in the widthwise direction of the controller 300. If the control housing 320 further includes a top side 327 according to a shape of the control housing 320, the body may include the front housing 321 and the top side 327.

An input unit 350 for a user to input information to control the oven range 10 may be located at the front housing 321.

The input unit 350 may include a plurality of knobs 351 installed on the front housing 321. A user may input information for cooking by manipulating the knob 351.

A display unit or display 370 that displays information of the oven range 10 may be provided on the front housing 321. The display unit 370 may be located between a plurality of the knobs 351. If the display unit 370 includes a touch panel, the display unit 370 may play a role as an input unit for receiving an input from a user, as well as a role in displaying the information on the oven range 10.

The electronic component unit 360 having various electronic components located therein may be located in the accommodation space S. The electronic component unit 360 may include control PCB 361 that controls the oven range 10 by receiving information on cooking from a user.

The control PCB 361 may be located in the accommodation space S as well as on a backside of the display unit 370. Alternatively, the control PCB 361 may be located between a plurality of the knobs 351 as well as in the accommodation space S.

The lateral sides 323 and 325 may include first lateral side 323 located at one or a first end of the front housing 321 in the widthwise direction, and second lateral side 325 located at the other or a second end of the front housing 321 in the widthwise direction, thereby sealing the accommodation space S together with the front housing 321.

The first lateral side 323 and the second lateral side 325 may be configured to face each other in a manner of being spaced apart from each other. In addition, the first lateral side 323 and the second lateral side 325 may be configured to have bilateral symmetry (or mirror symmetry). Therefore, the body may extend from the first lateral side 323 to the second lateral side 325 along the widthwise direction of the controller 300.

To form the cooling flow path 310, an intake 330 and a discharge 340 that provide communication between an outside of the controller 300 and the accommodation space S may be provided at the first lateral side 323 and the second lateral side 325, respectively. If the intake 330 is formed in or at the first lateral side 323, the discharge 340 may be provided in or at the second lateral side 323. Alternatively, the discharge 340 may be provided in or at the first lateral side 323 and the intake 330 may be formed in or at the second lateral side 325. For clarity, the following description will be made on the assumption that the intake 330 and the discharge part 340 formed in the first lateral side 323 and the second lateral side 325, respectively.

The intake 330 may include a perforated hole formed by perforating a portion of the first lateral side 323. Moreover, the intake 330 may include a plurality of perforated holes, thereby inducing a larger air current. The discharge 340 may include a perforated hole formed by perforating a portion of the second lateral side 325. Moreover, the discharge 340 may include a plurality of perforated holes, thereby inducing a larger air current. Thus, air situated outside of the controller 300 may enter the accommodation space S through the intake 330 to cool the control PCB 361, and the air having cooled the control PCB 361 may then be discharged from the controller 300 through the discharge 340.

In some embodiments, although the intake 330 and the discharge 340 are provided, if there is no means for creating a flow of air, the cooling flow path may be configured to function by natural convention. In order to form a current of air flowing through the cooling flow path 310 more efficiently, one embodiment further includes fan assembly 380 that creates a flow of air.

Figure 6A:
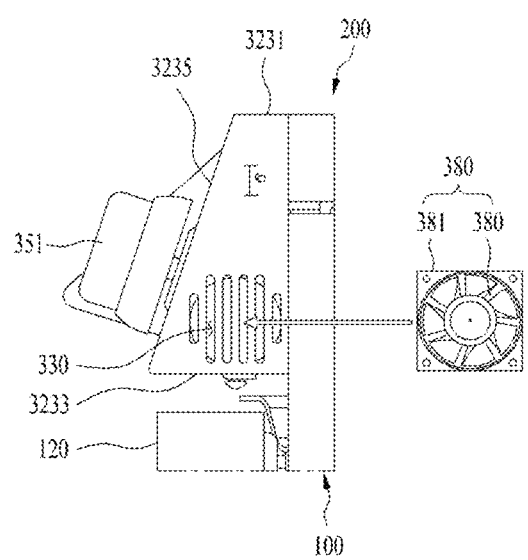
FIGS. 6A-6B are schematic diagrams showing a fan assembly according to an embodiment installed.
Figure 6B:
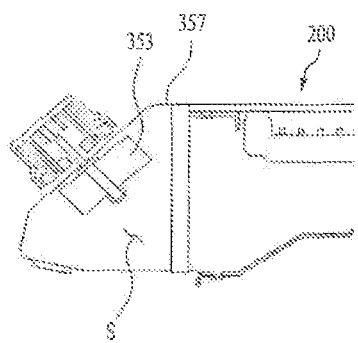

Hereinafter, fan assembly 380 is described with reference to FIGS. 6A-6B. FIG. 6A shows the controller 300 having the fan assembly 380 installed therein according to an embodiment. FIG. 6B shows a limited space of the accommodation space S.

Referring to FIG. 6A, the fan assembly 380 may be installed at one of the first lateral side 323 or the second lateral side 325 to create an air current. In a case in which the fan assembly 380 is installed at the first lateral side 323, the fan assembly 380 may create a flow of air from an outside of the controller 300 into the accommodation space S. In a case in which the fan assembly 380 is installed at the second lateral side 325, the fan assembly 380 installed at the second lateral side 325 may create a flow of air from the accommodation space S to the outside of the controller 300. Of course, a flow direction of air created by the fan assembly 380 may vary depending on locations of the intake 330 and the discharge 340.

A size of the accommodation space S is limited. That is, as the controller 300 is space-limited by the cooktop 200 and the main body 100, the size of the accommodation space S is limited as well. Hence, the fan assembly 380 may be installed at the first lateral side 323 or the second lateral side 325. Further, the fan assembly 380 may be located in consideration of a shape of the first lateral side 323 or the second lateral side 325.

The first lateral side 323 may include a top end 3231 located at a highest position in a vertical direction and a bottom end 3233 located at a lowest position in the vertical direction, and may also include an inclined portion 3235 that connects the bottom end 3233 and the top end 3231 together.

The inclined portion 3235 may be configured such that a predetermined length in the frontward-rearward direction increases toward to the bottom end 3233 from the top end 3231. That is, the inclined portion 3235 may extend from the top end 3231 toward a front side in a manner of being inclined downward and then be connected to the bottom end 3233.

The fan assembly 380 may be installed adjacent to the bottom end 3233 of the first lateral side 323 rather than the top end 3231 of the first lateral side 323. That is, the fan assembly 380 may be provided closer to the bottom end 3233 of the first lateral side 323 than to the top end 3231 of the first lateral side 323. The fan assembly 380 may be located at the bottom end 3233 of the first lateral side 323, thereby enhancing space efficiency.

The fan assembly 380 may include a fan 383 that creates an air current, and a fan housing 381 in which the fan 383 is installed. The fan housing 381 may contact the inclined portion 3235 and the bottom end 3233 of the first lateral side 323, respectively, thereby maximizing utilization of space. In this case, the fan housing 381 and the fan 383 may be located in the accommodation space S in a manner of being installed on or at one surface of the first lateral side 383 facing the accommodation space S.

Although the above description relates to a case in which the fan assembly 380 is located on the first lateral side 323, the fan assembly 380 may be located on the second lateral side 325 as well. In addition, the fan assembly 380 may be located on the first lateral side 323 only and a separate configuration for creating an air current may not be provided at the second lateral side 325.

In some embodiments, fan assembly 380 is provided at the second lateral side 325 as well, and the second lateral side 325 may include a top end, a bottom end and an inclined portion, and the fan assembly 380 may be located closer to the bottom end rather than to the top end. As the details are redundant with those of the first lateral side 323, they have been omitted.

Thus, as a flow of air is created in the cooling flow path 310, the electronic component unit 360 may be cooled efficiently. Further, as the control PCB 361 is cooled in a manner of directly contacting with air, manufacturing costs may be saved in comparison to the related art.

Referring to FIG. 6B, a path of the air guided into the accommodation space S through the intake 330 may be bent despite communicating with the electronic component unit 360. In a case in which the input unit 350 includes the knob 351, a knob fastener 353, which supports the knob 351 on the body 321 by being fastened to the knob 351, may be located in the accommodation space S. As the air guided into the accommodation space S through the intake 330 interferes with the knob fastener 353, it may be difficult to efficiently cool the electronic component unit 360.

One embodiment disclosed herein further includes a guide 400 configured to extend a limited size of the accommodation space S and enable air flowing through the cooling flow path 310 to cool the electronic component unit 360 efficiently.

Figure 7:
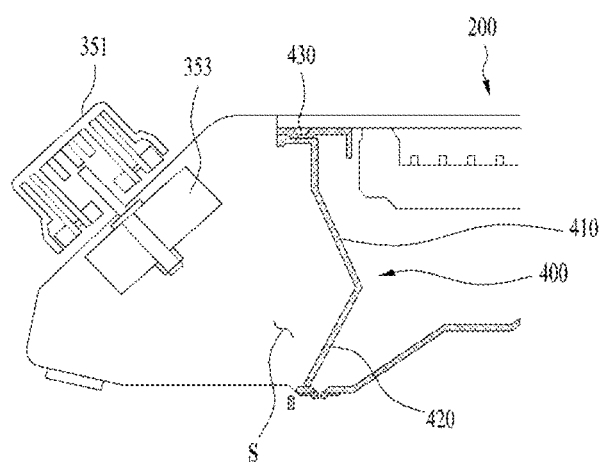
FIG. 7 is a schematic diagram showing a guide according to an embodiment.

FIG. 7 is a diagram showing a guide according to an embodiment. Guide 400 is described with reference to FIG. 7 hereinafter.

Referring to FIG. 7, the guide 400 may include a knob fastener 430 coupled to the cooktop 200 or the controller 300, a first space extending portion 410 inclined from the knob fastener 430 to extend the accommodation space S, and a second space extending portion 420 that extends from the first space extending portion 410 to be coupled to the cooktop 200 or the controller 300. The knob fastener 430 may have a hook shape so as to be fastened to the cooktop 200 or the controller 300. The cooktop 200 or the controller 300 may have a shape corresponding to the knob fastener 430. Further, the knob fastener 430 may include a projection and the controller 300 may include a recess corresponding to the projection. In addition, the knob fastener 430 may be formed on a top end of the guide 400.

The first space extending portion 410 may extend from the knob fastener 430 to be inclined downward toward a rear side. That is, the first space extending portion 410 may extend into the accommodation space S in the rearward direction. The second space extending portion 420 may extend from the first space extending portion 410 to be inclined downward toward the front side. A bent portion may be formed at a point at which the first space extending portion 410 and the second space extending portion 420 are connected together.

Thus, the guide 400 may form smaller flow resistance in the accommodation space S by extending the accommodation space S. More particularly, as the first space extending portion 410 and the second space extending portion 420 extend in different directions, respectively, the air flowing in the accommodation space S may be enabled to flow intensively toward the electronic component unit 360. In addition, when the fan assembly 380 is located at the bottom end 3233 of the first lateral side 323, the first space extending portion 410 and the second space extending portion 420 may have different heights in the vertical direction, respectively.

Figure 8A:
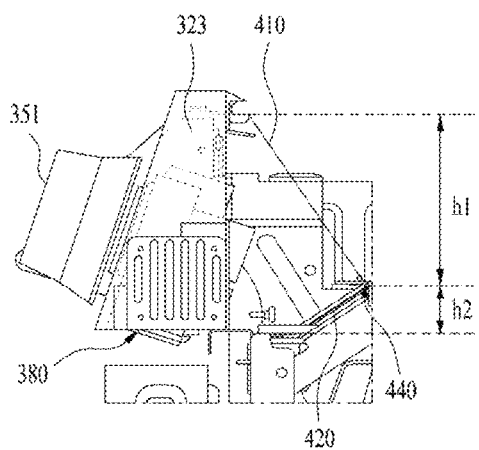
FIGS. 8A and 8B are schematic diagrams showing a spacer and a guide according to an embodiment.

Referring to FIG. 8A, a height h1 formed in the vertical direction by the first space extending portion 410 may be greater than a height h2 formed in the vertical direction by the second space extending portion 420. Thus, the air flowing into the accommodation space S by the fan assembly 380 may be guided toward the guide 400 in a manner of being bent by the knob fastener 353, and the air guide by the guide 400 is enabled to flow smoothly to the electronic component unit 360 by a point, that is, a bent portion 440, at which the first space extending portion 410 and the second space extending portion 420 are connected together.

In this case, if the fan assembly 380 is installed at the first lateral side 323, the fan assembly 380 may not be installed at the second lateral side 325. That is, in the case in which an air current is created at each of both end portions of the controller 300, the air guided by the guide 400 flows to the discharge 340 rather than to the electronic component unit 360.

Figure 8B:
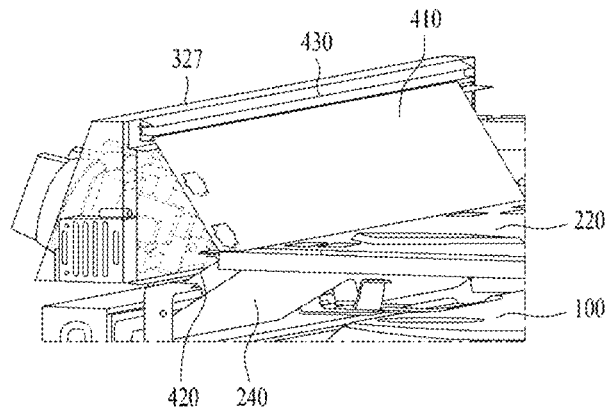

Referring to FIG. 8B, the second space extending portion 420 may be installed in consideration of a shape of the cooktop 200. The cooktop 200 may include a support plate 227 that supports the cooktop heater 230 and a spacer 240 that spaces the support plate 227 from each of the controller 300 and the main body 100.

The support plate 227 may be spaced apart from the main body 100 in an upward direction and may be spaced in the rearward direction with reference to the controller 300. One or a first end of the spacer 240 may be coupled to a front end of a top surface of the main body 100 (at a rear of the door) and the other or a second end may be coupled to the support plate 227, whereby the support plate 227 may be spaced apart from each of the controller 300 and the main body 100.

Thus, the cooktop 200 and the main body 100 may be spaced apart from each other, thereby preventing overload from being caused by heat transfer between them. In this case, the second space extending portion 420 may be seated on the spacer 240. Alternatively, the second space extending portion 420 may face the spacer 240.

Thus, the guide 400 may extend the accommodation space S by utilizing the inclined space formed by the spacer 240, and a shape of the guide 400 may enable air, which flows through the cooling flow path 310, to be guided to the electronic component unit 360.

The cooling flow path 310 according to an embodiment is described with reference to FIG. 9 hereinafter.

Figure 9:
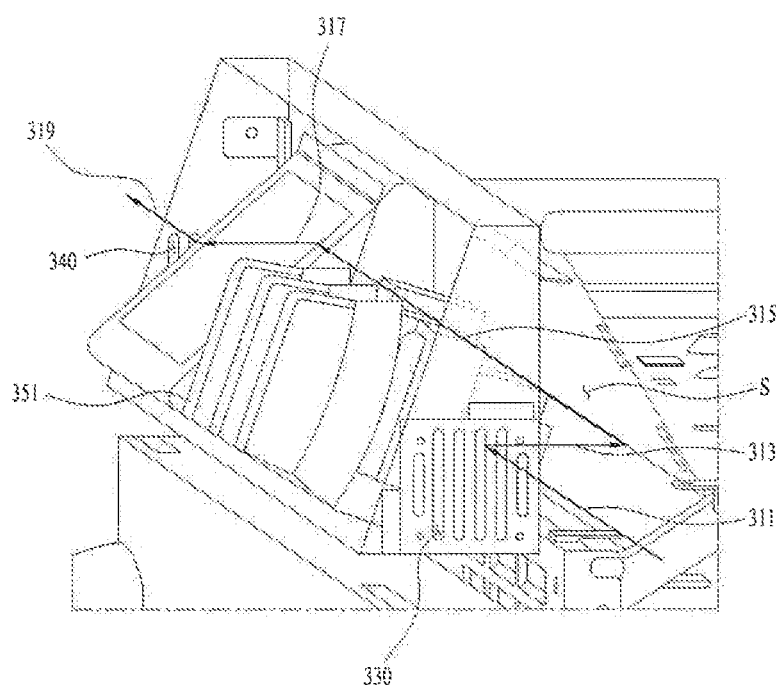
FIG. 9 is a schematic diagram showing a cooling flow path formed by a guide according to an embodiment.

FIG. 9 relates to a case in which the fan assembly 380 is installed at the first lateral side 323 only and the fan assembly 380 is not installed at the second lateral side 325. Referring to FIG. 9, the cooling flow path 310 may include an intake flow path 311 that guides air, which may be situated outside of the controller 300, to the accommodation space S through the intake 330, a first bent flow path 313 that guides the air, which is guided to the accommodation space S through the intake 311, toward the guide 400, a main flow path 315 that guides the air, which has flowed through the first bent flow path 313, to flow along the guide 400, a second bent flow path 317 that guides the air, which has flowed through the main flow path 315, to flow by being bent toward the controller 300, and a discharge flow path 319 that guides the air, which has flowed through the second bent flow path 317, outside of the controller 300 in a manner of flowing through the discharge 340. The air having flowed through the intake flow path 311 forms the first bent flow path 313 by contacting the knob fastener 353 and being bent toward the guide 400. Thus, the first bent flow path 313 may be formed by the knob fastener 353.

The air having flowed to the guide 400 through the first bent flow path 313 contacts the bent portion 440 and flows in the extended direction of the guide 400, thereby forming the main flow path 315. In doing so, if the fan assembly 380 is not installed at the second lateral side 325, the air flowing through the main flow path 315 may flow through the accommodation space S in the frontward-rearward direction, thereby cooling the electronic component unit 360 efficiently.

If the height h1 of the first space extending portion 410 in the vertical direction is different from the height h2 of the second space extending portion 420 in the vertical direction, the air flowing through the main flow path 315 may flow in the frontward-rearward direction more smoothly. This is because the bent portion 440 may be formed at a location that faces the fan assembly 380. The air having flowed through the main flow path 315 forms the second bent flow path 317 bent toward the controller 300 by coming in contact with the second lateral side 325 or the knob fastener 353 and is then discharged externally through the discharge 340.

If the fan assembly 380 is not installed at the second lateral side 325, the discharge 340 formed in the second lateral side 325 may be configured in a shape different from the intake 330. For example, a perforated hole formed by the discharge 340 may be located higher in the vertical direction than a perforated hole formed by the intake 330. Thus, a length of the cooling flow path 310 in an airflow direction of the flow path may be longer.

Although the cooling flow path 310 and the guide 400 are provided, it may be necessary to cut off heat, which is generated by the cooktop 200 and the main body 100, from being transferred to the accommodation space S as much as possible. Thus, an insulation member or layer 440 may be coupled to the guide 400 provided adjacent to the cooktop 200 and the main body 100 in the accommodation space S.

Figure 10:
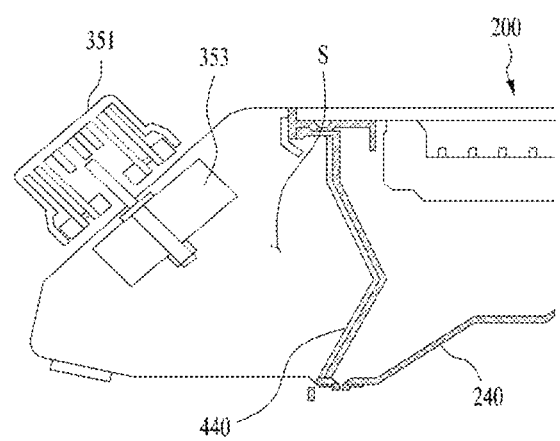
FIG. 10 is a schematic diagram showing that an insulation member coupled to a guide according to an embodiment.

FIG. 10 is a diagram showing an insulation member coupled to the guide according to an embodiment. Referring to FIG. 10, insulation member 440 may be provided on one surface of the guide 400 that faces the accommodation space S. A material of the insulation member 440 may be selected in consideration of a local temperature of the oven range 10. Thus, in a case in which the insulation member 440 is provided at one or a first surface of the guide 400 that faces the accommodation space S, the insulation member 440 may include a cold reserving material. On the other hand, in a case in which the insulation member 440 is provided on the other or a second surface of the guide unit 400 located in the direction away from the accommodation space S, the insulation member 440 may include a heat reserving material.

Accordingly, embodiments disclosed herein are directed to an oven range that substantially obviates one or more problems due to limitations and disadvantages of the related art.

Embodiments disclosed herein provide an oven range that forms a cooling flow path to cool an electronic component unit of an oven range with a low unit cost. Embodiments disclosed herein provide an oven range having a simple assembly process.

Further, embodiments disclosed herein provide an oven range that forms a cooling flow path for efficiently cooling a front portion of an oven range. Furthermore, embodiments disclosed herein provide an oven range that cools a controller that controls the oven range by receiving information on cooking from a user.

Embodiments disclosed herein provide an oven range including a small intake fan installed in a cooling flow path, and a flow path guide that enables a fluid flow formed by the intake fan to be concentrated on a control PCB. Embodiments disclosed herein also provide the oven range including the cooling flow path consisting of the intake fan and the flow path guide only, thereby saving a unit cost.

Additional advantages, objects, and features of the disclosure will be set forth in the disclosure as well as the accompanying drawings. Such aspects may also be appreciated by those skilled in the art based on the disclosure.

Embodiments disclosed herein provide an oven range that may include a main body forming an exterior, a cavity forming a space for cooking food within the main body, a door coupled to the main body selectively to open and close the cavity, a cooktop provided over the main body, and a controller located over the door and at a front end portion or end of the cooktop and having an electronic component installed therein. A cooling flow path may be formed in the controller to cool the electronic component. The cooling flow path may be formed in a widthwise direction of the controller.

The controller may include a control housing that forms an exterior of the controller, and an accommodation space inside, and an input unit that receives information on cooking by being coupled to the control housing. The electronic component may include a control PCB located in the accommodation space to control the information input through the input unit.

The input unit may include a plurality of knobs coupled to an outer surface of the control housing. The control PCB may be located between a plurality of the knobs.

The control housing may include a first lateral side coupled to the cooktop or the main body, a second lateral side spaced apart from the first lateral side and coupled to the cooktop or the main body, and a body coupled to the second lateral side in a manner of being extended from the first lateral side in a widthwise direction of the controller. The first lateral side may include an intake configured in a manner of perforating a portion of the first lateral side to guide air to the accommodation space. The second lateral side may include a discharge configured in a manner of perforating a portion of the second lateral side to guide air located in the accommodation space outside of the accommodation space.

A fan assembly that creates a flow of air may be coupled to at least one of the first lateral side or the second lateral side. The fan assembly may be provided to at least one of a bottom end of the first lateral side or a bottom of the second lateral side.

The controller may further include a guide unit or guide coupled to the control housing to extend the accommodation space. The guide unit may include a fastening part or fastener coupled to the control housing, and a first space extending part or portion extended from the fastening part in a manner of being inclined downward in a rearward direction. The guide unit may further include a second space extending part or portion extended from the first space extending part in a manner of being inclined downward in a frontward direction.

A height formed by the first space extending part in a top-bottom or vertical direction of the oven range may be greater than a height formed by the second space extending part in the top-bottom direction of the oven range.

The cooktop may be spaced apart from a top side of the main body in a top or upward direction and a rearward direction, respectively. The oven range may further include a spacing part or spacer coupled to the top side of the main body to space the cooktop apart from the main body. The second space extending part may be configured to face the spacing part.

The cooling flow path may include a first bent flow path that enables the air guided to the accommodation space through the intake to flow toward the guide unit, a main flow path that enables the air having flowed through the first bend flow path to flow along the guide unit, and a second bent flow path that extends the air having flowed through the main flow path to flow toward the discharge. The controller may further include an insulation member provided at one surface of the guide unit facing the accommodation space to prevent heat generated from the cavity or the cooktop from being transferred to the electronic component.

Accordingly, embodiments disclosed herein may provide at least the following effects and/or advantages.

First, according to an embodiment, a cooling flow path may be formed with a lower unit cost. Second, according to an embodiment, an oven range having a simple assembly process may be provided.

Third, according to an embodiment, a front portion of an oven range may be cooled efficiently. Fourth, according to an embodiment, a controller may be efficiently cooled.

Effects obtainable from embodiments are not limited to the above-mentioned advantages. Other unmentioned advantages may be clearly understood from the description by those having ordinary skill in the technical field to which the embodiments pertain.

It is to be understood that both the general description and the detailed description of embodiments are exemplary and explanatory and are intended to provide further explanation.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An oven range, comprising:
a main body that forms an exterior of the oven range;
a cavity that forms a space for cooking an item within the main body;
a door coupled to the main body to selectively open and close the cavity;
a cooktop provided over the main body; and
a controller located over the door and at a front end of the cooktop and having an electronic component installed therein, wherein a cooling flow path is formed in the controller to cool the electronic component, wherein the controller comprises:
a controller housing that forms an exterior of the controller and an accommodation space inside; and
an input unit coupled to the controller housing and that receives information on cooking, wherein the electronic component includes a control printed circuit board (PCB) located in the accommodation space to control the information input through the input unit, wherein the controller housing comprises:
a first lateral side coupled to the cooktop or the main body;
a second lateral side spaced apart from the first lateral side and coupled to the cooktop or the main body; and
a body coupled to the second lateral side and extending from the first lateral side in a widthwise direction of the controller, wherein the first lateral side includes an intake that extends through a portion of the first lateral side to guide air to the accommodation space, wherein the second lateral side includes a discharge that extends through a portion of the second lateral side to guide the air located in the accommodation space outside of the accommodation space; and
a fan that creates a flow of air coupled to at least one of the first lateral side or the second lateral side, and wherein the controller further comprises a guide coupled to the controller housing and extending into the accommodation space, and wherein the cooling flow path comprises:
a first bent flow path that directs the air guided to the accommodation space through the intake to flow toward the guide;
a main flow path that directs the air having flowed through the first bend flow path to flow along the guide; and
a second bent flow path that directs the air having flowed through the main flow path to flow toward the discharge.

2. The oven range of claim 1, wherein the cooling flow path is formed in the widthwise direction of the controller.

3. The oven range of claim 1, wherein the input unit comprises a plurality of knobs coupled to an outer surface of the controller housing, and wherein the control PCB is located between the plurality of the knobs.

4. The oven range of claim 1, wherein the fan is provided at at least one of a bottom end of the first lateral side or a bottom of the second lateral side.

5. The oven range of claim 1, the guide comprises:
a fastener coupled to the controller housing; and
a first space extending portion that extends from the fastener at a downward incline in a rearward direction of the oven range.

6. The oven range of claim 5, wherein the guide further comprises a second space extending portion that extends from the first space extending portion at a downward incline in a frontward direction of the oven range.

7. The oven range of claim 6, wherein a height formed by the first space extending portion in a vertical direction of the oven range is greater than a height formed by the second space extending portion in the vertical direction of the oven range.

8. The oven range of claim 6, wherein the cooktop is spaced apart from a top side of the main body in an upward direction and a rearward direction, respectively, and wherein the oven range further comprises a spacer coupled to the top side of the main body to space the cooktop apart from the main body.

9. The oven range of claim 8, wherein the second space extending portion is configured to confront the spacer.

10. The oven range of claim 1, wherein the controller further comprises an insulation member provided at one surface of the guide facing the accommodation space to prevent heat generated from the cavity or the cooktop from being transferred to the electronic component.

11. An oven range, comprising:
a main body that forms an exterior of the oven range;
a cavity that forms a space for cooking an item within the main body;
a door coupled to the main body to selectively open and close the cavity;
a cooktop provided over the main body; and
a controller located at an upper front end of the cooktop and having an electronic component installed therein, wherein a cooling flow path is formed in the controller to cool the electronic component, the cooling flow path extending along a widthwise direction of the controller; and
a fan that creates a flow of air along the cooling flow path, wherein the controller comprises:
a controller housing that forms an exterior of the controller and an accommodation space inside; and
an input unit coupled to the controller housing and that receives information on cooking, wherein the electronic component includes a control printed circuit board (PCB) located in the accommodation space to control the information input through the input unit, wherein the controller housing has an intake at a first lateral side and a discharge at a second lateral side for the cooling flow path, wherein the first lateral side is provided to the opposite side of the second lateral side, wherein the door is provided on a front portion of the main body, and wherein the first lateral side is one of a left portion of the main body and a right portion of the main body and the second lateral side is the other of the left portion of the main body and the right portion of the main body.

12. The oven range of claim 11, wherein the cooling flow path comprises an intake flow path that guides air to the controller housing through the intake.

13. The oven range of claim 11, wherein the cooling flow path comprises a discharge flow path that guides the air to outside of the controller housing through the discharge.

14. An oven range, comprising:
a main body that forms an exterior of the oven range;
a cavity that forms a space for cooking an item within the main body;
a door coupled to the main body to selectively open and close the cavity;
a cooktop provided over the main body;
a controller located at an upper front end of the cooktop and having an electronic component installed therein, wherein a cooling flow path is formed in the controller to cool the electronic component, the cooling flow path extending along a widthwise direction of the controller; and
a fan that creates a flow of air along the cooling flow path, wherein the controller comprises:
a controller housing that forms an exterior of the controller and an accommodation space inside; and
an input unit coupled to the controller housing and that receives information on cooking, wherein the electronic component includes a control printed circuit board (PCB) located in the accommodation space to control the information input through the input unit, wherein the controller housing has an intake at a first lateral side and a discharge at a second lateral side for the cooling flow path, wherein the controller is provided between the intake and the discharge, wherein the door is provided on a front portion of the main body, and wherein the first lateral side is one of a left portion of the main body and a right portion of the main body and the second lateral side is the other of the left portion of the main body and the right portion of the main body.

* * * * *